United States Patent [19]

Harford

[11] Patent Number: 5,479,137
[45] Date of Patent: Dec. 26, 1995

[54] CONTROLLED OSCILLATOR, AS FOR SYNCHYRONOUS VIDEO DETECTOR

[75] Inventor: Jack R. Harford, Flemington, N.J.

[73] Assignee: Samsung Electronics Co., Ltd., Kyungki-Do, Rep. of Korea

[21] Appl. No.: 165,936

[22] Filed: Dec. 14, 1993

[51] Int. Cl.$^6$ .................................................... H03B 5/12
[52] U.S. Cl. .................. 331/117 R; 331/117 FE;
  331/167; 331/45; 331/20; 455/204; 348/725;
  330/252; 330/260; 327/560
[58] Field of Search .................. 331/20, 114, 117 R,
  331/177 R, 36 C, 36 R, 45, 117 FE, 167,
  96, 108 C, 34; 455/260, 264, 204; 348/725;
  330/252, 260; 327/560, 563, 564

[56] References Cited

U.S. PATENT DOCUMENTS

| | | | |
|---|---|---|---|
| 4,370,676 | 1/1983 | Hongu et al. | 348/725 |
| 4,565,978 | 1/1986 | Fenk et al. | 331/117 R |
| 5,187,450 | 2/1993 | Wagner et al. | 331/96 |
| 5,198,784 | 3/1993 | Fenk | 331/117 R |

FOREIGN PATENT DOCUMENTS 0112006  8/1980  Japan .................................. 331/117 R Primary Examiner—Robert J. Pascal
Assistant Examiner—Arnold Kinkead
Attorney, Agent, or Firm—Sughrue, Mion, Zinn, Macpeak & Seas

[57] ABSTRACT

An oscillator, constructed partially within the confines of a monolithic integrated circuit, includes a differential-input, differential-output, differential amplifier within the monolithic integrated circuit. First and second resistive potential dividers located within the monolithic integrated circuit respectively divide the potentials appearing at the first and second output terminals of the differential amplifier in a predetermined ratio for respective application to the first and second input terminals of the differential amplifier, thereby respectively completing first and second direct-coupled regenerative feedback connections. An inductor located outside the monolithic integrated circuit is connected between the first and second input terminals of the differential amplifier and is anti-resonated by one or more capacitors, which may be located inside or outside the monolithic integrated circuit. In controlled versions of the oscillator, a further differential-input, differential-output, differential amplifier is included within the monolithic integrated circuit and connected to provide Miller amplification of capacitors used in anti-resonating the inductor. The gain of this further differential amplifier is electrically controlled for controlling the frequency of the oscillations generated by the oscillator. In addition to providing Miller feedback, which is degenerative in nature and tends in varying degree to reduce the amplitude of oscillations, this further differential amplifier is arranged for providing regenerative feedback to counteract this tendency to reduce the amplitude of oscillations.

15 Claims, 1 Drawing Sheet

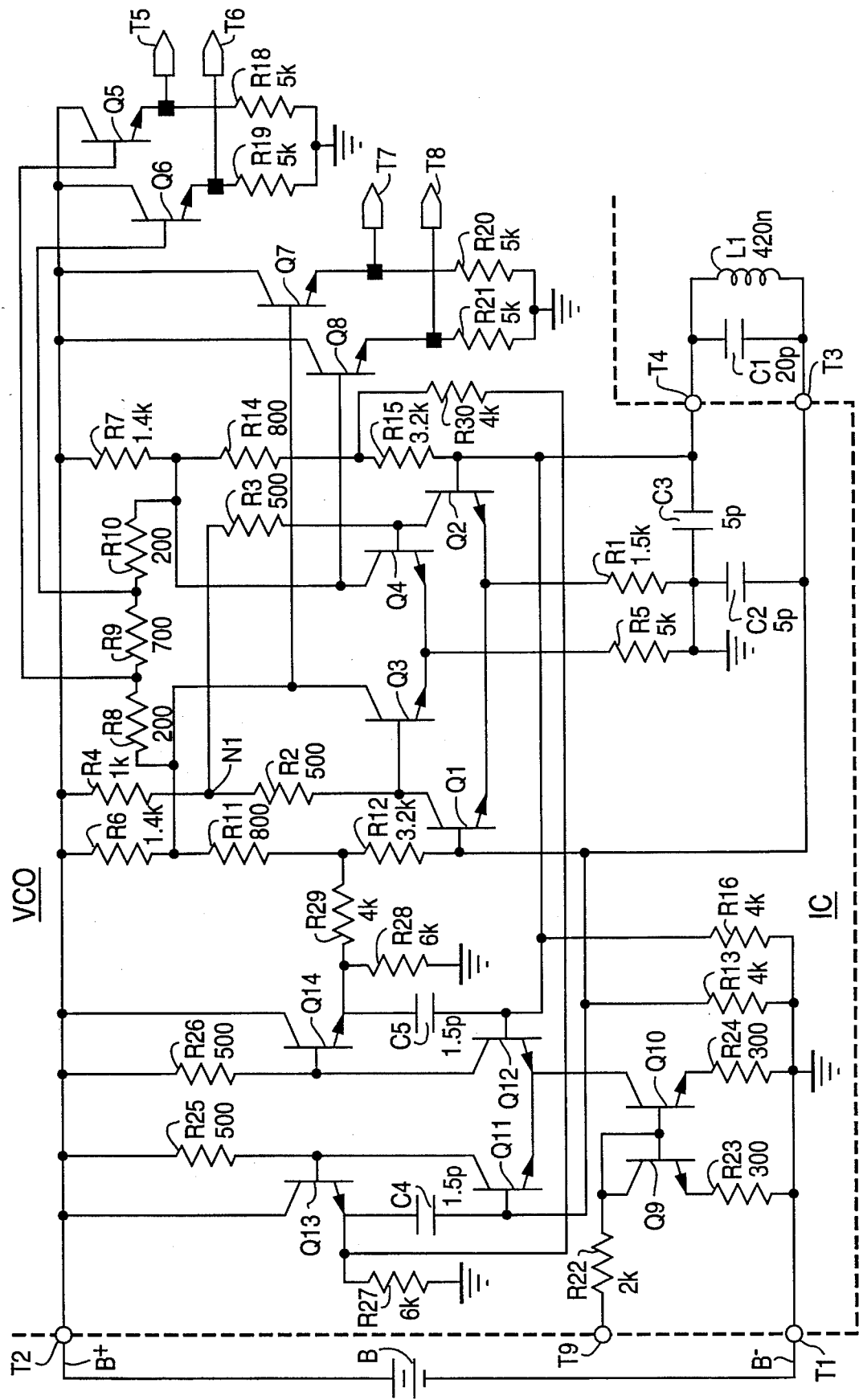

CONTROLLED OSCILLATOR, AS FOR SYNCHYRONOUS VIDEO DETECTOR

The invention relates to oscillators, the frequency and phase of oscillation of which can be electrically controlled.

BACKGROUND OF THE INVENTION

Oscillators with automatic frequency and phase control (AFPC) are used, for example, in the implementation of synchronous video detectors. It is commonplace practice to construct a synchronous video detector within the confines of the same monolithic integrated circuit (IC) as a plural-stage video intermediate-frequency (IF) amplifier. The synchronous detector is commonly of a "tree" type in which the collector currents of a first pair of emitter-coupled transistors operated as a differential-mode transconductance amplifier are synchronously switched by respective further pairs of emitter-coupled transistors operated as single-pole-double-throw current-mode switches. The "tree" type of synchronous detector can be designed to have appreciable conversion gain (20 dB or so), reducing the need for video IF voltage gain in the picture (PIX) IF amplifier supplying amplified video IF signal to the base electrodes of the first pair of emitter-coupled differential-amplifier transistors.

The recent practice in regard to implementing the IF filtering and gain functions in television signal receiving apparatus is to use a lumped or "block" filter preceding a gain-block amplifier comprising plural stages arranged in direct-coupled cascade within the confines of a monolithic integrated circuit (IC). The "block" filter is commonly a surface-acoustic-wave (SAW) filter used to provide the entire passband shape and adjacent channel attenuation required by a television receiver. No interstage tuning is used in the gain-block IC amplifier. The amplified IF signal from the gain-block IC amplifier is subsequently detected substantially within the confines of the monolithic integrated circuit, to emerge from the IC as baseband composite video signal and as sound IF at 4.5 MHz. The amplified IF signal is filtered from these signals to reduce the likelihood of regeneration causing the gain-block amplifier to oscillate. Additional information on SAW filters and on block filtering and amplification may be found, for example, in Chapter 13 of the book TELEVISION ENGINEERING HANDBOOK; K. Blair Benson, Editor in Chief; McGraw-Hill Book Company, New York; 1986. U.S. patent application Ser. No. 08/080,705 filed 24 Jun. 1993 by Jack Rudolph Harford, entitled PARALLEL UNTUNED VIDEO IF AMPLIFIERS SUPPLIED SIGNALS FROM TV $1^{ST}$ DETECTOR VIA RESPECTIVE INPUT FILTERS, and incorporated herein by reference provides further information concerning the use of SAW filters and gain block amplifiers for intermediate frequencies in television receivers.

Prior-art ICs having video IF amplifiers in gain-block configurations followed by synchronous detectors have used controlled oscillators of the following general type. An LC tank circuit serves as as a collector load for a transistor overdriven by regenerative feedback to its base electrode, so as to switch between saturated conduction and cut-off. This common arrangement exhibits some problems, however.

The voltage signal across the LC tank circuit is typically a few volts peak-to-peak, so stray coupling to the input of the video IF amplifier is apt to be consequential. This presents problems especially when IF sensitivity is made greater in response to commercial requirements.

The LC tank circuit used as the collector load for the switched transistor has a voltage signal across it from which harmonic content is removed by filtering, but the switched transistor current flow is conducted in unbalanced form through the IC "ground" connection and has appreciable harmonic content. The "ground" bus on the printed-circuit board on which the IC is mounted radiates this harmonic content back to the tuner to cause problems with Channel-8 reception, etc. These problems persist even when the LC tank circuit is driven push-pull by a pair of transistors switched in antiphase, since there is appreciable common-mode harmonic content.

The inventor sought an oscillator in which the LC tank circuit is in a portion of the circuitry where signal levels are at their lowest, rather than at their highest, to minimize the problems of radiation back to the tuner and to the IF amplifier input port. In order to reduce the oscillations and harmonics thereof appearing on the operating supply busses for the IC, the inventor sought an oscillator of balanced construction. A differential ampitier of the so-called "long-tailed pair" type using a pair of emitter-coupled bipolar transistors in its construction is a favored circuit with balanced construction suitable for inclusion in a monolithic IC. Locating the LC tank circuit between the base electrodes of the emitter-coupled transistors, rather than between their collector electrodes, allows the low-resistance path through the tank coil to keep the base electrodes at substantially equal direct potentials, simplifying input biasing.

SUMMARY OF THE INVENTION

The invention in one of its aspects is embodied in an oscillator, constructed partially within the confines of a monolithic integrated circuit. A differential-input, differential-output, differential amplifier is located within the monolithic integrated circuit. This differential amplifier has first and second output terminals, which are not available for connection to external elements, and has first and second input terminals available for connection to external elements. A first resistive potential divider located within the monolithic integrated circuit is connected for dividing in a predetermined ratio the potential appearing at the first output terminal of the differential amplifier and for applying that divided potential to the first input terminal of the differential amplifier, thereby to complete a first direct-coupled regenerative feedback connection. A second resistive potential divider located within the monolithic integrated circuit is connected for dividing in the same predetermined ratio the potential appearing at the second output terminal of the differential amplifier and for applying that divided potential to the second input terminal of the differential amplifier, thereby to complete a second direct-coupled regenerative feedback connection. An inductor located outside the monolithic integrated circuit has the first and second ends of its winding respectively connected to the first input terminal and to the second input terminal of the differential amplifier. A capacitor has first and second plates respectively connected to the first input terminal and to the second input terminal of the differential amplifier, for forming together with the inductor an anti-resonant circuit that determines or helps determine the natural frequency of oscillations from the oscillator. This capacitor may be located inside or outside the monolithic integrated circuit or may be formed by paralleling a first component capacitor located inside the monolithic integrated circuit with a second component capacitor located outside the monolithic integrated circuit.

The invention in another of its aspects is embodied in a controlled oscillator, constructed partially within the confines of a monolithic integrated circuit.

BRIEF DESCRIPTION OF THE DRAWING

The sole figure is a schematic diagram of a controlled oscillator that embodies a principal aspect of the invention.

DETAILED DESCRIPTION

The sole figure shows a controlled oscillator suitable for construction within a monolithic integrated circuit IC together with other circuitry, not shown. Terminals T1 and T2 of the monolithic integrated circuit IC are shown for respectively receiving a relatively negative operating supply voltage B– and a relatively positive operating supply voltage B+ from an operating supply B, shown as a battery, but normally provided by rectifying and filtering a stepped-down-in-potential alternating-current from the household mains. The substrate of the monolithic integrated circuit IC is referred to the relatively negative operating supply voltage, which will accordingly be denominated "ground" potential. The relatively positive operating supply voltage B+ at terminal T2 is for example around +9 V., as referred to operating potential. Terminals T3 and T4 have connected between them an oscillator tank coil L1 located outside the monolithic integrated circuit IC. Terminals T5 and T6 provide a first set of push-pull square-wave responses to the oscillations of the FIG. 1 oscillator, and terminals T7 and T8 provide a second set of push-pull square-wave responses to the oscillations of the FIG. 1 oscillator. The frequency and phase of the nominally 45.75 MHz oscillations of the oscillator are controlled (in a manner described later on) by an automatic frequency and phase control (AFPC) signal voltage applied to the terminal T9.

The oscillator tank coil L1 tunes against the combined capacitance of a capacitor C1 and other capacitances which parallel capacitor C1 and are located within the monolithic integrated circuit IC. One of these paralleling other capacitances is the series capacitance of stray capacitors C2 and C3 respectively shunting the terminals T3 and T4 to ground. Another of these paralleling other capacitances is the series capacitance of capacitors C4 and C5 as controllably multiplied by Miller effect in response to AFPC signal supplied to the terminal T9. Capacitors C4 and C5 are of metal-insulator-semiconductor (MIS) construction.

As will be explained in more detail further on, 45.75 MHz oscillations of about 125 mV. peak-to-peak are sustained across the oscillator tank connected between the terminals T3 and T4, which connect to the base electrodes of NPN transistors Q1 and Q2, respectively. The low-resistance path through the winding of the tank coil L1 maintains the base electrodes of Q1 and Q2 at substantially the same direct potentials. A coupling resistor R1 connects from the interconnected emitters of Q1 and Q2 to IC ground. Resistors R2 and R3 provide collector loads for Q1 and Q2, respectively, connecting from their collectors to a node N1. A dropping resistor R4 connects the supply terminal T2 to the node N1 to supply the node N1 a positive operating potential (e.g. 7.3 V.) reduced respective to B+. Q1 and Q2 are connected, then, as a emitter-coupled differential amplifier for amplifying the oscillations between their base electrodes to 1.2 V. peak-to-peak oscillations between their collector electrodes, which connect to the base electrodes of NPN transistors Q3 and Q4, respectively. This emitter-coupled differential amplifier comprising Q1 and Q2 operates as a linear amplifier, owing to the 45.75 MHz oscillations between their base electrodes being constrained to be only about 125 mV. peak-to-peak. This swing is small enough that neither of the transistors Q1 and Q2 is completely removed from conduction during oscillator operation. The common-mode current flow through the coupling resistor R1 is preponderantly a direct current flow and the relatively small rectified 45.75 MHz oscillations being even-harmonic in nature fall outside the VHF television bands.

Q3 and Q4 are also connected as an emitter-coupled differential amplifier, with a coupling resistor R5 connected between the interconnection of their emitters and ground. However, the 1.2 V. peak-to-peak drive between their base electrodes is sufficiently large to cause limiter operation, in which Q3 and Q4 are alternately switched into full conduction and into non-conduction, causing square-wave voltages to appear at their resistively loaded collectors. Though they conduct square-wave currents, the emitter-coupled transistors Q3 and Q4 conduct those currents on a balanced basis and are laid out within the IC die so corresponding ones of their connections to the operating supply rails are the same points, to keep square-wave current off the supply rails. Resistors R6 and R7 connecting from the supply terminal T2 to the collectors of Q3 and Q4, respectively, form part of this resistive loading. Resistors R8, R9 and R10 connected in series between the collectors of Q3 and Q4 provide another part of their resistive loading. The collector of Q3 is still further resistively loaded by a resistive voltage divider comprising the resistors R11, R12 and R13 connected in series between the collector of Q3 and ground; and the collector of Q4 is still further resistively loaded by a resistive voltage divider comprising the resistors R14, R15 and R16 connected in series between the collector of Q4 and ground. These voltage dividers provide regenerative feedback connections to the base electrodes of Q1 and Q2, respectively, for sustaining oscillations in the tank circuit connected therebetween. The Q of the oscillator tank coil L1 is such that there is a 5 kilohm equivalent shunt resistance across the oscillator tank, which equivalent shunt resistance provides a further degree of differential-mode voltage division and a bit heavier resistive collector loading to Q3 and Q4. The 700 mV. peak-to-peak square-wave voltages appearing at the resistively loaded collectors of Q3 and Q4 are divided down and are filtered by the tank circuit to apply about a 120 mV. peak-to-peak sine-wave voltage between terminals T3 and T4, which respectively connect to the base electrodes of Q1 and Q2.

Resistors R18, R19, R20 and R21 provide respective emitter load resistors for common-collector-amplifier NPN transistors Q5, Q6, Q7 and Q8. The 700 mV. peak-to-peak square-wave voltages appearing at the resistively loaded collectors of Q3 and Q4 are divided by the resistors R8, R9 and R10 connected in series between them to furnish 400 mV. peak-to-peak square-wave voltages to the base electrodes of Q5 and Q6. The respective emitter-follower actions of Q5 and Q6 apply the divided square-wave voltages to the terminals T5 and T6 for subsequent application to circuitry for developing automatic frequency and phase control (AFPC) signal. Though they conduct square-wave currents, the two emitter-follower transistors Q5 and Q6 conduct those currents on a balanced basis and are laid out within the monolithic integrated circuit IC die so that corresponding ones of their connections to the operating supply rails are the same points, to keep square-wave current off the supply rails. The respective emitter-follower actions of Q7 and Q8 apply the 700 mV. peak-to-peak square-wave voltages appearing at the collectors of Q3 and Q4 to the terminals T7 and T8 without voltage-division for subsequent application to other circuitry, as can be constructed within the confines of the monolithic integrated circuit IC. Though they conduct square-wave currents, the two emitter-follower transistors Q7 and Q8 conduct those currents on a balanced basis and are laid out within the IC die so corresponding ones of their connections to the operating supply rails are the same points, to keep square-wave current off the supply rails. Keeping square-wave current off the supply rails reduces the radiation from the oscillator via the operating supply connections to and from the monolithic integrated circuit IC.

The AFPC of the oscillator is now to be considered. As noted previously, the capacitances of capacitors C4 and C5 are controllably multiplied by Miller effect in response to AFPC signal supplied to the terminal T9. The AFPC signal is supplied as a voltage to the terminal T9 and applied to one end of a resistor R22 having its other end connected to the input connection of a current mirror amplifier (CMA) comprising NPN transistors Q9 and Q10 and resistors R23 and R24 providing them respective emitter degeneration. First ends of R23 and R24 connect to ground thus providing the common connection of the CMA and their second ends connect to the emitters of Q9 and Q10, respectively. The collector of Q10 is the output connection of the CMA, which demands a current proportional to the AFPC signal voltage applied to the terminal T9.

This current is withdrawn as tail current from the interconnected emitters of NPN transistors Q11 and Q12, the respective base electrodes of which connect to the terminals T3 and T4 to receive the 45.75 MHz oscillations developed across the oscillator tank. The regulation of the amplitude of the oscillations as they appear between the terminals T3 and T4 to 125 mV. peak-to-peak in order that the amplification in the emitter-coupled differential-amplifier connection of Q1 and Q2 be linear also provides for the amplification in the emitter-coupled differential-amplifier connection of Q11 and Q12 to be linear as well. Linearity of amplification is essential to the operation of the emitter-coupled differential-amplifier connection of Q11 and Q12 as a Miller amplifier for multiplying the capacitances of the capacitors C4 and C5. Resistors R25 and R26 connect from the supply terminal T2 to the collectors of Q11 and Q12. Assuming the resistances of R25 and R26 to be equal, the voltage gain of the emitter-coupled differential-amplifier connection of Q11 and Q12 is the product of that resistance times the transconductance of Q11 and of Q12. The transconductance of Q11 and of Q12 is proportional to the tail current withdrawn from their interconnected emitters and thus to the AFPC signal voltage applied to the terminal T9.

The amplified response at the collectors of Q11 and Q12 to the oscillations between the terminals T3 and T4 to which first plates of the capacitors C4 and C5 connect is applied to the second plates of those capacitors by the respective emitter-follower actions of common-collector-amplifier NPN transistors Q13 and Q14, respectively. This completes the Miller feedback loop connections that multiply the capacitances of the capacitors C4 and C5. The amount of Miller multiplication of these capacitances is controlled by the voltage gain of the emitter-coupled differential-amplifier connection of Q11 and Q12, which is controlled by the AFPC signal voltage applied to the terminal T9. Accordingly, the Miller multiplication of the capacitances of the capacitors C4 and C5, and in turn the tuning of the oscillator tank circuit, is controlled in response to the AFPC signal voltage applied to the terminal T9.

Resistors R27 and R28 provide respective emitter load resistors for common-collector-amplifier transistors Q13 and Q14. A resistor R29 connects from the emitter of Q14 to the interconnection of resistors R11 and R12, and a resistor R30 connects from the emitter of Q13 to the interconnection of resistors R14 and R15. Resistors R29 and R30 apply controlled regenerative feedback that raises oscillator gain as Miller amplification increases the apparent capacitances of the capacitors C4 and C5. This compensates for the reduction of oscillator gain that otherwise would occur as the Miller feedback, which is degenerative in nature increases. Since both feedback effects depend on the controlled voltage gain of the emitter-coupled differential-amplifier connection of Q11 and Q12, tracking of the compensation can be made automatic by suitable scaling of element impedance values.

What is claimed:

1. An oscillator, constructed partially within a monolithic integrated circuit, said oscillator comprising:

a first differential-input, differential-output, differential amplifier located within said monolithic integrated circuit, having first and second input terminals available for connection to external elements, having first and second output terminals not available for connection to external elements, exhibiting non-inverting differential-mode voltage gain both from its first input terminal to its first output terminal and from its second input terminal to its second output terminal, and including first and second transistors that have respective base electrodes at the first and second input terminals of said first differential amplifier, that have respective emitter electrodes coupled to each other, that have respective collector electrodes coupled to separate ones of the first and second output terminals of said first differential amplifier, and that are connected for operation as a linear amplifier during oscillator operation;

a first resistive potential divider located within said monolithic integrated circuit and connected for dividing in a predetermined ratio a potential appearing at the first output terminal of said first differential amplifier for application to its first input terminal, thereby completing a first direct-coupled regenerative feedback connection;

a second resistive potential divider located within said monolithic integrated circuit and connected for dividing in said predetermined ratio a potential appearing at the second output terminal of said first differential amplifier for application to its second input terminal, thereby completing a second direct-coupled regenerative feedback connection;

an inductor located outside said monolithic integrated circuit, said inductor having a winding with first and second ends respectively connected to the first input terminal and to the second input terminal of said first differential amplifier; and capacitive means for tuning against said inductor in an anti-resonant tank circuit.

2. An oscillator, constructed partially within a monolithic integrated circuit, said oscillator comprising:

a first differential-input, differential-output, differential amplifier located within said monolithic integrated circuit, having first and second input terminals available for connection to external elements, having first and second output terminals not available for connection to external elements, and exhibiting non-inverting differential-mode voltage gain both from its first input terminal to its first output terminal and from its second input terminal to its second output terminal;

a first resistive potential divider located within said monolithic integrated circuit and connected for dividing in a predetermined ratio a potential appearing at the first output terminal of said first differential amplifier for application to its first input terminal, thereby completing a first direct-coupled regenerative feedback connection;

a second resistive potential divider located within said monolithic integrated circuit and connected for dividing in said predetermined ratio a potential appearing at the second output terminal of said first differential amplifier for application to its second input terminal, thereby completing a second direct-coupled regenerative feedback connection;

an inductor located outside said monolithic integrated circuit, said inductor having a winding with first and second ends respectively connected to the first input terminal and to the second input terminal of said first differential amplifier;

capacitive means for tuning against said inductor in an anti-resonant tank circuit;

first and second transistors included in said first differential amplifier, said first and second transistors having respective base electrodes at the first and second input terminals of said first differential amplifier, having respective emitter electrodes coupled to each other, and having respective collector electrodes;

third and fourth transistors included in said first differential amplifier, said third and fourth transistors having respective base electrodes to which the collector electrodes of said first and second transistors respectively direct couple, having respective emitter electrodes coupled to each other, and having respective collector electrodes direct coupling to the first and second output terminals of said first differential amplifier;

balanced collector loads for said first and second transistors included in said first differential amplifier, said balanced collector loads for said first and second transistors exhibiting sufficiently high respective load resistances that said third and fourth transistors are alternately conductive during oscillator operation; and balanced collector loads for said third and fourth transistors included in said first differential amplifier, said balanced collector loads for said third and fourth transistors which loads respectively include said first resistive potential divider and said second resistive potential divider, said predetermined ratio of voltage division being such that neither of said first and second transistors is completely removed from conduction during oscillator operation.

3. An oscillator as set forth in claim 2, further comprising:

first and second capacitors included in said capacitive means for tuning against said inductor in an anti-resonant tank circuit, having respective first plates respectively connected to the first input terminal and to the second input terminal of said first differential amplifier, and having respective second plates; and a second differential-input, differential-output, differential amplifier located within said monolithic integrated circuit, having first and second input terminals respectively connected to the first input terminal and to the second input terminal of said first differential amplifier, having first and second output terminals respectively connected to the second plate of said first capacitor and to the second plate of said second capacitor, and exhibiting inverting differential-mode voltage gain both from its first input terminal to its first output terminal and from its second input terminal to its second output terminal, said second differential amplifier thereby providing Miller feedback for multiplying the effective capacitances of said first and second capacitors.

4. An oscillator as set forth in claim 3, which is of a type the oscillations of which have frequency and phase that are alterable in response to a control signal, said oscillator accordingly including:

means for controlling in response to said control signal said inverting differential-mode voltage gain exhibited by said second differential amplifier.

5. An oscillator as set forth in claim 4 including:

means for regeneratively feeding back signals from the first and second output terminals of said second differential amplifier to its second and first input terminals.

6. An oscillator as set forth in claim 5 wherein said means for regeneratively feeding back signals from the first and second output terminals of said second differential amplifier to its second and first input terminals comprise:

a pair of further resistors having respective first ends connected at the first and second output terminals of said second differential amplifier, respectively, and having respective second ends connected to a point in said second resistive potential divider and to a point in said first resistive potential divider, respectively.

7. An oscillator as set forth in claim 4, wherein said second differential amplifier comprises:

fifth and sixth transistors having respective base electrodes at the first and second input terminals of said second differential amplifier, having respective emitter electrodes with an interconnection therebetween, and having respective collector electrodes direct coupled to the first and second output terminals of said second differential amplifier;

balanced collector loads for said fifth and sixth transistors; and means, responding to said control signal, for determining quiescent currents flowing through the emitter electrodes of said fifth and sixth transistors through said interconnection therebetween, and thus determining the respective transconductances of said fifth and sixth transistors.

8. An oscillator, constructed partially within a monolithic integrated circuit, said oscillator comprising:

a first differential-input, differential-output, differential amplifier located within said monolithic integrated circuit, having first and second input terminals available for connection to external elements, having first and second output terminals not available for connection to external elements, exhibiting non-inverting differential-mode voltage gain both from its first input terminal to its first output terminal and from its second input terminal to its second output terminal, and including first and second transistors that have respective base electrodes at the first and second input terminals of said first differential amplifier, that have respective emitter electrodes coupled to each other, and that have respective collector electrodes coupled to separate ones of the first and second output terminals of said first differential amplifier by coupling circuitry of a type that limits amplitudes of output signals from the first and second output terminals of said first differential amplifier without placing said first and second transistors into saturated conduction that will interfere with their operation being substantially linear;

an inductor located outside said monolithic integrated circuit, said inductor having a winding with first and second ends respectively connected to the first input terminal and to the second input terminal of said first differential amplifier;

capacitive means for tuning against said inductor in an anti-resonant tank circuit;

a first resistive potential divider included in said coupling circuitry, located within said monolithic integrated circuit, and connected for dividing in a predetermined ratio a potential appearing at the first output terminal of said first differential amplifier for application to its first input terminal, thereby completing a first direct-coupled regenerative feedback connection;

a second resistive potential divider included in said coupling circuitry, located within said monolithic integrated circuit, and connected for dividing in said predetermined ratio a potential appearing at the second output terminal of said first differential amplifier for application to its second input terminal, thereby completing second direct-coupled regenerative feedback connection; and balanced loads for the first and second output terminals of said first differential amplifier which loads respectively include said first resistive potential divider and said second resistive potential divider, said predetermined ratio of voltage division being such that during oscillator operation said first and second transistors exhibit substantially linear operation without either being completely removed from conduction.

9. An oscillator, constructed partially within a monolithic integrated circuit, said oscillator comprising:

a first differential-input, differential-output, differential amplifier located within said monolithic integrated circuit, having first and second input terminals available for connection to external elements, having first and second output terminals not available for connection to external elements, exhibiting non-inverting differential-mode voltage gain both from its first input terminal to its first output terminal and from its second input terminal to its second output terminal, and including first and second transistors that have respective base electrodes at the first and second input terminals of said first differential amplifier, that have respective emitter electrodes coupled to each other, and that have respective collector electrodes coupled to separate ones of the first and second output terminals of said first differential amplifier by coupling circuitry, said coupling circuitry being of a type that limits amplitudes of output signals from the first and second output terminals of said first differential amplifier without placing said first and second transistors into saturated conduction that will interfere with their operation being substantially linear;

third and fourth transistors that are included in said coupling circuitry, that have respective base electrodes to which the collector electrodes of said first and second transistors respectively direct couple, that have respective emitter electrodes coupled to each other, and that have respective collector electrodes direct coupling to the first and second output terminals of said first differential amplifier;

an inductor located outside said monolithic integrated circuit, said inductor having a winding with first and second ends respectively connected to the first input terminal and to the second input terminal of said first differential amplifier;

capacitive means for tuning against said inductor in an anti-resonant tank circuit;

a first resistive potential divider included in said coupling circuitry, located within said monolithic integrated circuit, and connected for dividing in a predetermined ratio a potential appearing at the first output terminal of said first differential amplifier for application to its first input terminal, thereby completing a first direct-coupled regenerative feedback connection;

a second resistive potential divider included in said coupling circuitry, located within said monolithic integrated circuit, and connected for dividing in said predetermined ratio a potential appearing at the second output terminal of said first differential amplifier for application to its second input terminal, thereby completing a second direct-coupled regenerative feedback connection; and balanced loads for the first and second output terminals of said first differential amplifier which loads respectively include said first resistive potential divider and said second resistive potential divider, said predetermined ratio of voltage division being such that during oscillator operation said first and second transistors exhibit substantially linear operation without either being completely removed from conduction.

10. An oscillator, constructed partially within a monolithic integrated circuit, said oscillator comprising:

a first differential-input, differential-output, differential amplifier located within said monolithic integrated circuit, having first and second input terminals available for connection to external elements, having first and second output terminals not available for connection to external elements, exhibiting non-inverting differential-mode voltage gain both from its first input terminal to its first output terminal and from its second input terminal to its second output terminal, and including first and second transistors that have respective base electrodes at the first and second input terminals of said first differential amplifier, that have respective emitter electrodes coupled to each other, and that have respective collector electrodes coupled to separate ones of the first and second output terminals of said first differential amplifier by coupling circuitry of a type that limits amplitudes of output signals from the first and second output terminals of said first differential amplifier without placing said first and second transistors into saturated conduction that will interfere with their operation being substantially linear;

an inductor located outside said monolithic integrated circuit, said inductor having a winding with first and second ends respectively connected to the first input terminal and to the second input terminal of said first differential amplifier;

capacitive means for tuning against said inductor in an anti-resonant tank circuit;

a first resistive potential divider included in said coupling circuitry, located within said monolithic integrated circuit, and connected for dividing in a predetermined ratio a potential appearing at the first output terminal of said first differential amplifier for application to its first input terminal, thereby completing a first direct-coupled regenerative feedback connection;

a second resistive potential divider included in said coupling circuitry, located within said monolithic integrated circuit and connected for dividing in said predetermined ratio a potential appearing at the second output terminal of said first differential amplifier for application to its second input terminal, thereby completing a second direct-coupled regenerative feedback connection; and balanced loads for the first and second output terminals of said first differential amplifier which loads respectively include said first resistive potential divider and said second resistive potential divider, said predetermined ratio of voltage division being such that during oscillator operation said first and second transistors exhibit substantially linear operation without either being completely removed from conduction;

first and second capacitors included in said capacitive means for tuning against said inductor in an antiresonant tank circuit, having respective first plates respectively connected to the first input terminal and to the second input terminal of said first differential amplifier, and having respective second plates; and a second differential-input, differential-output, differential amplifier located within said monolithic integrated circuit, having first and second input terminals respectively connected to the first input terminal and to the second input terminal of said first differential amplifier, having first and second output terminals respectively connected to the second plate of said first capacitor and to the second plate of said second capacitor, and exhibiting inverting differential-mode voltage gain both from its first input terminal to its first output terminal and from its second input terminal to its second output terminal, said second differential amplifier thereby providing Miller feedback for multiplying the effective capacitances of said first and second capacitors.

11. An oscillator as set forth in claim 10, which is of a type the oscillations of which have frequency and phase that are alterable in response to a control signal, said oscillator accordingly including:

means for controlling in response to said control signal said inverting differential-mode voltage gain exhibited by said second differential amplifier.

12. An oscillator as set forth in claim 11, including means for regeneratively feeding back signals from the first and second output terminals of said second differential amplifier to its second and first input terminals.

13. An oscillator as set forth in claim 12, wherein said means for regeneratively feeding back signals from the first and second output terminals of said second differential amplifier to its second and first input terminals comprise:

a pair of further resistors having respective first ends connected at the first and second output terminals of said second differential amplifier, respectively, and having respective second ends connected to a point in said second resistive potential divider and to a point in said first resistive potential divider, respectively.

14. An oscillator as set forth in claim 11, wherein said second differential amplifier comprises:

third and fourth transistors having respective base electrodes at the first and second input terminals of said second differential amplifier, having respective emitter electrodes with an interconnection therebetween, and having respective collector electrodes direct coupled to the first and second output terminals of said second differential amplifier; and means, responding to said control signal, for determining quiescent currents flowing through the emitter electrodes of said third and fourth transistors through said interconnection therebetween, and thus determining the respective transconductances of said third and fourth transistors.

15. An oscillator as set forth in claim 4, including:

compensating circuitry to compensate for the reduction of oscillator gain that tends to occur with increase in said Miller feedback for multiplying the effective capacitances of said first and second capacitors, said compensating circuitry comprising:

a first regenerative feedback path from the first output terminal of said second differential amplifier to its second input terminal, said first feedback path including a portion of said first resistive potential divider; and a second regenerative feedback path from the second output terminal of said second differential amplifier to its first input terminal, said second feedback path including a portion of said second resistive potential divider.

\* \* \* \* \*